United States Patent
Tobisawa et al.

(10) Patent No.: US 7,910,639 B2
(45) Date of Patent: Mar. 22, 2011

(54) RESIN COMPOSITIONS, PREPREGS AND LAMINATES

(75) Inventors: Akihiko Tobisawa, Tokyo (JP); Takayoshi Masaki, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 0 days.

(21) Appl. No.: 11/491,538

(22) Filed: Jul. 21, 2006

(65) Prior Publication Data

US 2007/0060673 A1 Mar. 15, 2007

(30) Foreign Application Priority Data

Jul. 22, 2005 (JP) ................................ 2005-211988

(51) Int. Cl.
*H01B 3/40* (2006.01)
*C08F 283/00* (2006.01)

(52) U.S. Cl. ........................................ 523/451; 525/523

(58) Field of Classification Search .................. 523/451; 525/523

See application file for complete search history.

(56) References Cited

U.S. PATENT DOCUMENTS

| | | | | |
|---|---|---|---|---|
| 6,040,417 | A * | 3/2000 | Cho et al. | 528/279 |
| 6,486,242 | B1 * | 11/2002 | Tobisawa et al. | 524/117 |
| 6,551,714 | B1 * | 4/2003 | Tobisawa | 428/416 |
| 7,008,555 | B2 | 3/2006 | Hayes | |
| 2005/0038279 | A1 | 2/2005 | Dittrich | |
| 2006/0074154 | A1 * | 4/2006 | Harashina et al. | 524/115 |
| 2006/0247343 | A1 * | 11/2006 | Kishimoto et al. | 524/117 |

FOREIGN PATENT DOCUMENTS

| | | |
|---|---|---|
| EP | 1 116 774 A2 | 7/2001 |
| EP | 1 612 244 A1 | 1/2006 |
| JP | 11-124489 | 5/1999 |
| JP | 2000-212249 | 8/2000 |
| JP | 2001-254001 | 9/2001 |
| JP | 2004-067968 A | 3/2004 |
| JP | 2004-292495 A | 10/2004 |
| WO | WO 2004/085537 A1 | 10/2004 |

OTHER PUBLICATIONS

English translation of JP 11-124289 (May 11, 1999) Nov. 2008.*
Chinese Office Action dated Jun. 12, 2010 in Chinese.
Chinese Office Action dated Jun. 12, 2010 in English.

* cited by examiner

*Primary Examiner* — Mark Eashoo
*Assistant Examiner* — Megan McCulley
(74) *Attorney, Agent, or Firm* — The Webb Law Firm

(57) ABSTRACT

The present invention relates generally to resin compositions having a generally halogen-free epoxy resin that can encompass a novolak epoxy resin, a curing agent and a non-halogen flame-retardant material. For some embodiments, the curing agent can be dicyandiamide and the flame retardant can be 10-benzyl-9,10-dihydro-9-oxa-10-phosphaphenanthrene-10-oxide. Embodiments of the current invention also relate generally to prepregs prepared from such resin compositions; and laminates prepared from such prepregs.

16 Claims, No Drawings

RESIN COMPOSITIONS, PREPREGS AND LAMINATES

PRIORITY

This application claims priority to Japanese Patent Application No. 2005-211988, entitled "Resin Compositions, Prepregs and Laminates," filed Jul. 22, 2005, the content of which is incorporated by reference in its entirety.

TECHNICAL FIELD

Embodiments of the present invention relate generally to resin compositions, prepregs prepared by employing such compositions, and laminates prepared by employing such prepregs, and more specifically to such resin composition embodiments that exhibit an acceptable degree of flame retardancy without reliance on halogen-containing compounds for such flame retardancy, and prepregs and laminates prepared from such resin composition embodiments.

BACKGROUND

Compositions containing thermosetting resins, such as epoxy resins, are widely used for electric and electronic parts since the cured products of such resin compositions excel in mechanical, electrical and chemical properties. Such resin compositions can be provided with increased flame retardancy to increase safety against fire.

One of the methods known for imparting flame retardancy to resin compositions has been to incorporate halogen-containing compounds, such as brominated epoxy resins, into the resin composition. Examples of such known methods are described in JP-A 2000-212249.

Halogen-containing compounds can impart a higher degree of flame retardancy to a resin composition than the resin composition alone. However, some halogenated compounds present additional concerns. Brominated aromatic compounds, for example, can release corrosive bromine and/or hydrogen bromide when pyrolyzed and can form highly toxic polybromodibenzofuran and polydibromobenzoxine when decomposed in the presence of oxygen. Furthermore, superannuated waste materials containing bromine are very difficult to dispose of. For these reasons, flame retardants that can be used instead of halogen-containing compounds would be desirable.

Methods employing phosphorus compounds, such as phosphine oxide compounds, have been used in flame-retardation techniques as alternatives to the use of halogen-containing compounds. Examples of such techniques are described in JP-A 2001-254001, JP-A 2004-067968, and JP-A H11-124489.

With methods employing phosphorus compounds instead of halogen-containing compounds, it is possible to circumvent the above problems caused by the use of halogen-containing compounds. However, depending upon the phosphorus compounds used, the resulting resin compositions can be unsatisfactory in terms of the chemical stability of the compositions during storage. Additionally, in some applications of the resin compositions, improvements in the characteristics other than flame retardancy, such as heat resistance and adhesion with copper foils or the like, may be of equal or greater importance.

Thus, it would be advantageous to provide solutions that can be readily implemented, such solutions directed to the above-related technical problems that can occur with the technology of flame-retardant resin compositions. It would be desirable for such solutions to provide increased flame retardancy but without the problems associated with the use of halogen-containing compounds. It would also be desirable for such solutions to provide a suitable storage stability of the resin compositions. Further, it would be advantageous to provide resin compositions suitable for use in the preparation of prepregs for laminates, which compositions exhibit desirable heat resistance and adhesion with various materials, for example metal foils (such as copper foils), as well as prepregs and laminates prepared therefrom. Additionally, it would be advantageous to provide flame retardants suitable for use in the preparation of resin compositions.

DETAILED DESCRIPTION

Exemplary embodiments of the invention will be described below. In some embodiments, a resin composition of the invention encompasses a halogen-free epoxy resin that encompasses a novolak epoxy resin; a nitrogen-containing curing agent; and a flame retardant encompassing a substituted O=P—O group.

In some embodiments, the curing agent is one or more of amines, aromatic amines, cyclic amines, aliphatic amines, alkyl amines, carboxylic acid amines, carboxylic acid hydrazides, polyamides, dicyandiamide and isomers thereof, substituted ureas, imidazoles, tertiary amines, or epoxy-modified amine products thereof. In one embodiment, at least one curing agent employed is dicyandiamide.

In some embodiments, the flame retardant encompasses one or more substituents such as an alkyl, alkenyl, alkinyl, aryl, glycidyl, cyclic, and alicyclic groups. In some embodiments, the flame retardant encompasses a benzyl substituent, and in an exemplary embodiment, the flame retardant encompasses 10-benzyl-9,10-dihydro-9-oxa-10-phosphaphenanthrene-10-oxide.

One exemplary resin composition embodiment in accordance with the present invention encompasses a halogen-free epoxy resin having a novolak epoxy resin; dicyandiamide; and 10-benzyl-9,10-dihydro-9-oxa-10-phosphaphenanthrene-10-oxide. In some embodiments, the amount of the novolak epoxy resin in the halogen-free epoxy resin can be in the range of 60 to 90% by weight of the total amount of said halogen-free epoxy resin, and in other embodiments in the range of 65 to 75% by weight of the total amount of said halogen-free epoxy resin. One exemplary type of novolak epoxy resin is a cresol-novolak epoxy resin.

In embodiments of the present invention that employ dicyandiamide as a curing agent, the dicyandiamide can be present in the range of 3 to 6% by weight of the total amount of said halogen-free epoxy resin. In other such embodiments a range of 3.5 to 5.5% by weight of the total amount of said halogen-free epoxy resin can be employed.

In embodiments of the present invention that employ 10-benzyl-9,10-dihydro-9-oxa-10-phosphaphenanthrene-10-oxide as a flame retardant material, such material can be present in the range of 13 to 28% by weight of the total amount of the halogen-free epoxy resin. In other such embodiments, the range of 15 to 22% by weight of the total amount of said halogen-free epoxy resin for such flame-retardant material can be employed.

Embodiments in accordance with the present invention also provide a prepreg obtained by impregnating a fiber substrate with a resin composition according to the invention.

In some such embodiments, the prepreg is obtained by dissolving or dispersing a resin composition embodiment of the invention in a solvent to prepare a resin varnish and impregnating a fiber substrate with such resin varnish.

Embodiments in accordance with the present invention also provide a laminate obtained by hot-pressing at least one of the aforementioned prepreg embodiments of the invention with another material or structure.

For example, a metal-clad laminate in accordance with the present invention is obtained by hot-pressing at least one such prepreg and at least one metal foil.

Other metal-clad laminate embodiments of the present invention are obtained by placing two or more of such prepregs one over another to prepare a stack of prepregs where such stack has a top and a bottom surface, placing a metal foil over at least one of such top and bottom surfaces, and hot-pressing the stack and the foil.

Embodiments in accordance with the present invention further provide a non-halogen containing flame retardant for resin compositions. One exemplary flame retardant being 10-benzyl-9,10-dihydro-9-oxa-10-phosphaphenanthrene-10-oxide. Some such embodiments also encompass dicyandiamide.

Embodiments in accordance with the present invention also encompass the use of 10-benzyl substituted 9,10-dihydro-9-oxa-10-phosphaphenanthrene-10-oxides as a flame-retardant agent in a resin composition which further encompasses an epoxy resin including a novolak epoxy resin. In one embodiment, the resin composition can further encompass dicyandiamide.

As used herein, all numbers expressing dimensions, physical characteristics, and so forth, used in the specification and claims are to be understood as being modified in all instances by the term "about". Accordingly, unless indicated to the contrary, the numerical values set forth in the following specification and claims can vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques. Moreover, all ranges disclosed herein are to be understood to encompass the beginning and ending range values and any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1 to 3.3, 4.7 to 7.5, 5.5 to 10, and the like.

Embodiments of the present invention are directed to eliminating or reducing one or more of the aforementioned technical problems of imparting flame retardancy to resin compositions, prepregs made from such compositions and laminates formed from such prepregs. Some exemplary embodiments encompass resin compositions that exhibit a desired flame retardancy without the use of halogen-containing compounds. Such resin composition embodiments can also exhibit a desired storage stability. As mentioned above, other exemplary embodiments of the present invention also encompass prepregs produced by using the resin composition embodiments of the invention, as well as laminate embodiments produced by using such prepregs. The laminates prepared by such prepregs can exhibit improved flame retardancy, heat resistance, and adhesion to materials such as metal foils, as compared with conventional laminates. Thus, these laminates can be suitably employed in the fabrication of printed circuit boards where flame retardancy, heat resistance, and adhesion are desirable without the problems associated with the use of halogen-containing resins and prepregs for forming such laminates.

Resin Composition

Some embodiments in accordance with the present invention encompass resin compositions having a non-halogenated epoxy resin, such as a novolak epoxy resin, a curing agent such as dicyandiamide, and a flame retardant material such as 10-benzyl-9,10-dihydro-9-oxa-10-phosphaphenanthrene-10-oxide.

It should be noted that the aforementioned novolak epoxy resins can serve to increase the crosslinking density of the resin composition to confer an increased flame retardancy and heat resistance to the cured products.

Exemplary novolak epoxy resins that can be utilized in the epoxy resin compositions of the invention include, but are not limited to, cresol novolak epoxy resins, phenolic novolak epoxy resins, bisphenol A novolak epoxy resins, and the like. One type of novolak epoxy resin can be used or, alternatively, two or more types of novolak epoxy resins can be used simultaneously. In one embodiment where it is advantageous to reduce the water absorption of the cured products to improve the moisture resistance under a high humidity atmosphere, cresol novolak epoxy resins can be used.

The amount of the novolak epoxy resin can be any amount to achieve a desired result in accordance with the invention. In one embodiment, the total amount of novolak epoxy resin is in the range of 60 to 90% by weight based on the total weight of the epoxy resin. In another embodiment, the amount of the novolak epoxy resin(s) can be in the range of 65 to 75% by weight based on the total weight of the epoxy resin. The amount of the novolak epoxy resin(s) can be adjusted to vary the workability characteristics, such as the drilling and punching characteristics, of the resin composition to provide the specific set of such characteristics that are desired.

In addition to the aforementioned novolak epoxy resins, the resin compositions of the present invention can contain epoxy resins other than novolak epoxy resins. Examples of such other epoxy resins include, but are not limited to, liquid or solid bisphenol A epoxy resins, bisphenol F epoxy resins, and the like. In this connection, the combined use of liquid bisphenol A and/or bisphenol F epoxy resins with the novolak epoxy resin can improve their impregnation into a fiber substrate. The combined use of solid bisphenol A and/or bisphenol F epoxy resins with the novolak epoxy resin can improve their adhesion with metal foils, such as foils encompassing copper, iron, aluminum, stainless steel and the like.

While embodiments in accordance with the present invention generally encompass non-halogenated epoxy resins within the resin composition, such embodiments can advantageously achieve a level of flame retardancy comparable to that of the known art without employing halogen-containing compounds. Therefore, such embodiments avoid the production of corrosive and toxic components that can result from halogenated materials upon their thermal decomposition.

While the above-described embodiments utilize only non-halogenated resins, in other embodiments it may be possible to have minor or trace amounts of one or more halogenated resins or other halogenated materials present. By "minor or trace amounts" is meant that, if present, the amount of any such halogenated resins or materials is sufficiently low so as not to render the resin composition commercially undesirable due to the presence of such halogenated resins. In one embodiment, the halogenated resins or materials, if present, are in an amount less than 1% by weight, such as less than 0.5% by weight, such as less than 0.1% by weight based on the total weight of the epoxy resins.

The resin compositions of the invention generally include one or more curing agents for the epoxy resins. Exemplary curing agents can include, but are not limited to, aromatic amines, cyclic amines, aliphatic amines, alkyl amines, carboxylic acid amides, carboxylic acid hydrazides, polyamides, dicyandiamide and isomers thereof, substituted ureas, imidazoles, tertiary amines, or any epoxy-modified amine products thereof. Specific examples of such curing agents are found in U.S. Pat. No. 7,008,555 at, for example, column 6, line 5 to column 9, line 65.

Some embodiments in accordance with the present invention encompass a resin composition that includes dicyandiamide and/or isomers thereof as a curing agent. Advantageously, it has been found that such a curing agent can also serve to enhance both the adhesiveness to metal foils and heat resistance of products formed from a resin composition embodiment of the present invention, for example prepregs and laminates.

More specifically, and illustrative of this unexpected effect is that when dicyandiamide and/or isomers thereof are used as a curing agent for resin composition embodiments of the present invention, it is possible to increase the glass transition temperature of the cured product, hence enhancing its heat resistance. Furthermore, when prepregs produced by such resin composition embodiments are subjected to hot-pressing to produce, for example, a copper-clad laminate, such laminates are found to exhibit excellent peeling strength and enhanced stability for such peeling strength. Without wishing to be bound by any theory, it is believed that a nitrogen-containing group, such as the $NH_2$ group of the dicyandiamide, serves to enhance the adhesiveness between the insulating prepreg layer and the exemplary copper foils.

In the resin composition embodiments in accordance with the present invention, any desired amount of dicyandiamide can be used. In one non-limiting embodiment, the dicyandiamide is in the range of 3 to 6% by weight based on the total weight of the epoxy resin(s) (% wt). In another embodiment, the amount of dicyandiamide can be in the range of 3.5 to 5.5% wt. Generally, as the amount of dicyandiamide is reduced, adhesion between the resin and the metal, e.g., copper foils, can decrease. If the amount of dicyandiamide is increased above its solubility level, the dicyandiamide can precipitate, which can deteriorate the heat resistance of the cured products.

In some embodiments, the resin composition can also include a flame-retardant agent having a substituted O=P—O group. The substituents group can be, for example, selected from alkyl, alkenyl, alkinyl, aryl, and glycidyl groups. Examples of such flame retardants are described in US 2005/0038279 A1 at, for example, paragraph 0072 and paragraphs 0114 to 0116.

In some embodiments, the flame retardant can be of the general type of formula I below and described in the aforementioned '279 application.

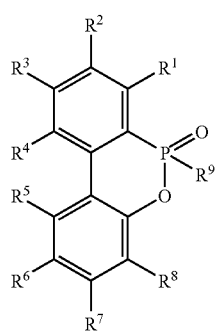

I where $R^1$ and $R^8$ can be any desired moiety. For example, $R^1$ to $R^8$ can independently be a hydrogen, halogen, or hydrocarbon (optionally containing one or more heteroatoms, for example, oxygen, nitrogen, sulphur, phosphorous, silicon, and halogen). In some embodiments, $R^1$ to $R^8$ can independently be alkoxy, alkylthio, optionally substituted alkenyl, optionally substituted alkinyl, optionally substituted unsaturated rings, optionally substituted aromatic rings. Specific examples of suitable moieties for $R^1$ to $R^8$ include, but are not limited to, those described in the '279 application at paragraphs 0029 to 0071.

$R^9$ can be any desired moiety. In some embodiments, $R^9$ is as described above for $R^1$ to $R^8$. In other embodiments, $R^9$ can independently be an alkyl, alkenyl, alkinyl, aryl, or glycidyl group. In still other embodiments, $R^9$ is an electron donor or electron rich group, such as but not limited to a benzyl group.

In some embodiments in accordance with the present invention, the flame-retardant agent having a substituted O=P—O group within the resin composition embodiments is 10-benzyl-9,10-dihydro-9-oxa-10-phosphaphenanthrene-10-oxide. With this ingredient, in contrast to flame retardants having halogens, it is possible to impart flame retardancy to the cured product without the problems associated with halogen-containing flame retardants.

In some resin composition embodiments in accordance with the present invention, dicyandiamide and 10-benzyl-9,10-dihydro-9-oxa-10-phosphaphenanthrene-10-oxide are present together.

Specifically, without wishing to be bound to any theory, it is believed that the nitrogen-containing group, for example $NH_2$ group in dicyandiamide, and the substituted O=P—O group, for example in 10-benzyl-9,10-dihydro-9-oxa-10-phosphaphenanthrene-10-oxide, chemically interact. Due to this interaction, it is believed that the reaction rate between dicyandiamide and the epoxy resin is reduced, thus providing for only a gradual increase in the viscosity of the resin composition that is caused by the reaction of both ingredients. Further, it is believed that the aforementioned interaction serves to maintain the solubility of dicyandiamide with respect to the epoxy resins. Ordinarily, dicyandiamide has a relatively low solubility with respect to epoxy resins, such as novolak epoxy resins, and if the dicyandiamide precipitates during the curing stage, the heat resistance of the cured product will generally be lowered from a desired value. In contrast, in the resin composition embodiments of the present invention, dicyandiamide can be caused to react sequentially with the epoxy resins without causing any significant reduction in the heat resistance of the cured products. As a result, the glass transition temperature can be increased without reducing the heat resistance of the cured products, improving the adhesion of the composition with copper foils.

However, when conventional phosphine oxide compounds such as bis(3-aminophenyl) methyl phosphine oxide (m-DAMPO), bis(3-aminophenyl)phenyl phosphine oxide (m-DAPPO) or isobutylbis(hydroxymethyl) phosphine oxide are used as the flame retardant, the interaction between phosphine oxides and dicyandiamide is weak, thus allowing the dicyandiamide to precipitate from resin compositions. Further to this weak interaction, an increased amount of dicyandiamide may be needed to cure the resin and some of this dicyandiamide will not be consumed and also precipitate. Alternatively, when conventional 9,10-dihydro-9-oxa-10-phosphaphenanthrene-10-oxide is used as a flame retardant, since the interaction between the $NH_2$ group in dicyandiamide and the unsubstituted O=P—O group in 9,10-dihydro-9-oxa-10-phosphaphenanthrene-10-oxide is strong, the curing agent will lose its activity because the curing agent is quickly consumed and, therefore, the resin may not be completely cured. For this case, the working life of the resin compositions may not be commercially acceptable. Further, when the curing agent is consumed and the curing level is not adequate, the heat resistance of the cured product will generally be lowered.

In contrast, in some resin composition embodiments of the present invention, the combined use of dicyandiamide and a phosphorus-containing compound such as 10-benzyl-9,10-dihydro-9-oxa-10-phosphaphenanthrene-10-oxide can provide an intermediate curing rate, thus allowing the viscosity of the resin composition to be gradually increased to maintain the solubility of dicyandiamide.

Thus, even though the novolak epoxy resins for which the solubility of dicyandiamide is generally low are used, it is possible to impart to the laminates a relatively higher adhesiveness and heat resistance in addition to flame retardancy.

In some resin composition embodiments in accordance with the present invention, the amount of 10-benzyl-9,10-dihydro-9-oxa-10-phosphaphenanthrene-10-oxide can be any desired amount. In one embodiment, the amount can be in the range of 13 to 28% by weight based on the total weight of the epoxy resin (% wt). In another embodiment, the amount of 10-benzyl-9,10-dihydro-9-oxa-10-phosphaphenanthrene-10-oxide can be in the range of 15 to 22% wt. As a general rule, as the content of 10-benzyl-9,10-dihydro-9-oxa-10-phosphaphenanthrene-10-oxide is reduced, flame retardancy as well as the aforesaid effect due to the chemical interaction with dicyandiamide can decrease. In addition, if the content of 10-benzyl-9,10-dihydro-9-oxa-10-phosphaphenanthrene-10-oxide is too high, the resin compositions can become overly hygroscopic for some uses.

In addition to the aforesaid ingredients, the resin compositions of the invention can also contain other thermosetting resins, such as, but not limited to, acrylic resins, additional curing agents such as those described above, curing accelerators such as, but not limited to, 2-methylimidazole or triphenylphosphine, inorganic fillers such as, but not limited to, silica gel and aluminum hydroxide, additional flame retardants such as those one or more of the conventional flame retardants described above, coupling agents such as, but not limited to, silane coupling agents, and other optional additives within the range satisfying the objectives of the present invention without causing any adverse effects.

As will be clear from the above explanation, some embodiments in accordance with the present invention encompass a flame retardant for use in a resin composition comprising an epoxy resin including a novolak epoxy resin. In one embodiment, the flame retardant is 10-benzyl-9,10-dihydro-9-oxa-10-phosphaphenanthrene-10-oxide. In another non-limiting embodiment, the resin composition into which the flame retardant is incorporated further comprises dicyandiamide.

Prepregs

The present invention also encompasses a prepreg obtained by impregnating a fiber substrate with a resin composition according to the present invention. With the use of the resin composition embodiments in accordance with the present invention, prepregs that are desirable in terms of various characteristics, such as but not limited to heat resistance, can be obtained.

The fiber substrates that can be used in the prepreg embodiments in accordance with the present invention can include, but are not limited to, glass fiber substrates such as substrates of glass woven fabric, glass nonwoven fabric, or the like; inorganic fiber substrates such as woven or nonwoven fabric substrates of inorganic compounds other than glass; and organic fiber substrates such as of aromatic or non-aromatic polyamide resins, aromatic or non-aromatic polyester resins, polyimide resins, fluorine resins or the like. Among these fiber substrates, glass fiber substrates, such as those of glass woven fabric, can provide high mechanical strength and low water absorption.

In order to impregnate the fiber substrates with the resin compositions, the resin compositions can first be dissolved or dispersed in a solvent to prepare resin varnishes. Then, the fiber substrates can be impregnated with the resin varnishes, for example by immersing the fiber substrates into the resin varnishes, or coating the fiber substrates with the resin varnishes using various coaters, or spray coating the fiber substrates with the resin varnishes using spraying apparatuses, or in any other conventional manner.

Among these methods, the method of immersing the fiber substrates with the resin varnishes can be practiced using conventional impregnation coating apparatuses. With this method, it is possible to enhance the degree of impregnation of the resin varnishes into the fiber substrates.

The solvents that can be used in the resin varnishes can be selected from those conventional solvents known in the art. In one non-limiting embodiment, the solvents can advantageously be those solvents that exhibit relatively good solubility for the selected ingredients (such as for those epoxy resins constituting the resin compositions). Although poorer solvents can also be used within a range not causing adverse effects. As solvents exhibiting "good solubility", mention can be made of dimethylformamide, dimethylacetoamide, or the like. Suitable solvents also include, but are not limited to, acetone and methyl ethyl ketone.

The concentration of non-volatile substances in the resin varnishes can be any desired amount. By "non-volatile substances" is meant the amount of the resin composition present in the solvent. In one embodiment, the amount of non-volatile substances can be in the range of 40 to 80% by weight based on the total weight of the resin varnish (% wt), while in other embodiments such amount can be 50 to 65% wt. With the adjustment of the non-volatile concentration, the viscosity of the resin varnishes can be controlled to adjust, e.g., increase or decrease, impregnation of the varnishes into the fiber substrates.

In embodiments in accordance with the present invention, the fiber substrates are impregnated with the resin varnishes. The impregnated amount of the resin varnishes can be adjusted. The resulting substrates are dried at a prescribed temperature, for example 80 to 200° C., to obtain prepregs.

Laminates

The present invention also encompasses a laminate obtained by hot-pressing at least one prepreg of the invention. Another embodiment in accordance with the present invention encompasses a metal-clad laminate obtained by hot-pressing at least one prepreg of the invention and at least one metal foil. With the use of the prepreg embodiments in accordance with the present invention, laminates that are exceptional in terms of flame retardancy, heat resistance, and adhesion can be obtained.

When one prepreg is used, one or both of the upper and lower surfaces of the prepreg can be laminated with a metal foil or film. It is also possible to obtain a metal-clad laminate by using two or more prepregs. In such a case, two or more prepregs are stacked, and one or both of the outermost upper and lower surfaces of the stacked prepregs are laminated with a metal foil or film. The stack of prepregs and metal foils is then subjected to hot pressing to prepare metal-clad laminates. Thus, an embodiment of the present invention encompasses a metal-clad laminate obtained by placing two or more prepregs one over another to prepare a stack of prepregs, placing a metal foil on the top and/or bottom surfaces of the stack, and hot-pressing the stack and the foil.

The conditions for hot pressing can be any conditions to form the laminate. In one embodiment, the hot pressing conditions can be a temperature of 120 to 220° C., a pressure of 2 to 5 MPa, and a time of 0.5 to 3.0 hours.

EXAMPLES

The present invention will be described in more detail with reference to the examples below although the invention is not limited to the examples.

I. MATERIALS

In the following examples, the products listed below were employed:
(1) Cresol novolak epoxy resin: "EPICLON N-690" (epoxy equivalent: 210), manufactured by Dainippon Ink & Chemicals, Inc.;
(2) Phenol novolak epoxy resin: "EPICLON N-770" (epoxy equivalent: 190), manufactured by Dainippon Ink & Chemicals, Inc.;
(3) Bisphenol A epoxy resin (I): "EPICLON 850" (epoxy equivalent: 190), manufactured by Dainippon Ink & Chemicals, Inc.; and
(4) Bisphenol A epoxy resin (II): "EPICLON 7050" (epoxy equivalent: 1900), manufactured by Dainippon Ink & Chemicals, Inc.

II. EXAMPLES

Example 1

(1) Preparation of Resin Varnish: 70.0 parts by weight of EPICLON N-690 cresol novolak epoxy resin, 21.4 parts by weight of EPICLON 850 bisphenol A epoxy resin (I), 8.6 parts by weight of EPICLON 7050 bisphenol A epoxy resin (II), 4.7 parts by weight of dicyandiamide, 21.5 parts by weight of 10-benzyl-9,10-dihydro-9-oxa-10-phosphaphenanthrene-10-oxide, and 0.1 parts by weight of 2-methylimidazole were added to dimethylformamide to prepare a resin varnish with a non-volatile concentration of 55% by weight.

(2) Preparation of Prepregs: The varnish thus obtained was impregnated, in an amount of 80 parts by weight as non-volatile substances, in 100 parts by weight of a woven glass fabric (0.18 mm thick, manufactured by Nitto Boseki KK) and dried in a 150° C. drying oven for 5 minutes to produce a prepreg with a resin content of 44.4% by weight.

(3) Preparation of Laminates: Six sheets of the above prepreg were placed one over another, with a 35 μm thick electrolytic copper foil placed on the top and at the bottom of the pile, and subjected to hot compression molding under conditions of 40 MPa and 200° C. for 120 minutes to obtain a 1.2 mm thick double-sided copper-clad laminate.

In Examples 2-4 and Control Examples 1-2 below, the same procedures as in Example 1 were repeated to produce the appropriate prepreg and laminate.

Example 2

(1) Preparation of Resin Varnish: 77.6 parts by weight of EPICLON N-690 cresol novolak epoxy resin, 17.1 parts by weight of EPICLON 850 bisphenol A epoxy resin (I), 5.3 parts by weight of EPICLON 7050 bisphenol A epoxy resin (II), 3.9 parts by weight of dicyandiamide, 18.7 parts by weight of 10-benzyl-9,10-dihydro-9-oxa-10-phosphaphenanthrene-10-oxide, and 0.1 parts by weight of 2-methylimidazole were added to dimethylformamide to prepare a resin varnish with a non-volatile concentration of 55% by weight.

Example 3

(1) Preparation of Resin Varnish: 61.5 parts by weight of EPICLON N-690 cresol novolak epoxy resin, 35.8 parts by weight of EPICLON 850 bisphenol A epoxy resin (I), 2.7 parts by weight of EPICLON 7050 bisphenol A epoxy resin (II), 4.0 parts by weight of dicyandiamide, 23.6 parts by weight of 10-benzyl-9,10-dihydro-9-oxa-10-phosphaphenanthrene-10-oxide, and 0.1 parts by weight of 2-methylimidazole were added to dimethylformamide to prepare a resin varnish with a non-volatile concentration of 55% by weight.

Example 4

(1) Preparation of resin varnish: 69.6 parts by weight of EPICLON N-770 phenol novolak epoxy resin, 21.1 parts by weight of EPICLON 850 bisphenol A epoxy resin (I), 9.3 parts by weight of EPICLON 7050 bisphenol A epoxy resin (II), 5.0 parts by weight of dicyandiamide, 20.6 parts by weight of 10-benzyl-9,10-dihydro-9-oxa-10-phosphaphenanthrene-10-oxide, and 0.1 parts by weight of 2-methylimidazole were added to dimethylformamide to prepare a resin varnish with a non-volatile concentration of 55% by weight.

Control Example 1

70.0 parts by weight of EPICLON N-690 cresol novolak epoxy resin, 21.4 parts by weight of EPICLON 850 bisphenol A epoxy resin (I), 8.6 parts by weight of EPICLON 7050 bisphenol A epoxy resin (II), 4.7 parts by weight of dicyandiamide, 15.2 parts by weight of 9,10-dihydro-9-oxa-10-phosphaphenanthrene-10-oxide, and 0.1 parts by weight of 2-methylimidazole were added to dimethylformamide to prepare a resin varnish with a non-volatile concentration of 55% by weight.

Control Example 2

70.0 parts by weight of EPICLON N-690 cresol novolak epoxy resin, 21.4 parts by weight of EPICLON 850 bisphenol A epoxy resin (I), 8.6 parts by weight of EPICLON 7050 bisphenol A epoxy resin (II), 4.7 parts by weight of dicyandiamide, 19.4 parts by weight of triphenylphosphine oxide, and 0.1 parts by weight of 2-methylimidazole were added to dimethylformamide to prepare a resin varnish with a non-volatile concentration of 55% by weight.

III. EVALUATION

The components of the various resin compositions described in the Examples above are listed in TABLE 1. The resin varnishes and laminates prepared in the respective examples, control examples were evaluated as described below, and the results of the evaluation are shown in TABLE 2.

TABLE 1

| Component (parts by weight) | Ex. 1 | Ex. 2 | Ex. 3 | Ex. 4 | Control Ex. 1 | Control Ex. 2 |
|---|---|---|---|---|---|---|
| EPICLON N-690 | 70.0 | 77.6 | 61.5 | — | 70.0 | 70.0 |
| EPICLON N-770 | — | — | — | 69.6 | — | — |
| EPICLON 850 | 21.4 | 17.1 | 35.8 | 21.1 | 21.4 | 21.4 |
| EPICLON 7050 | 8.6 | 5.3 | 2.7 | 9.3 | 8.6 | 8.6 |
| Dicyandiamide | 4.7 | 3.9 | 4.0 | 5.0 | 4.7 | 4.7 |
| 10-benzyl-9,10-dihydro-9-oxa-10-phosphaphenanthrene-10-oxide | 21.5 | 18.7 | 23.6 | 20.6 | — | — |
| 9,10-dihydro-9-oxa-10-phosphaphenanthrene-10-oxide | — | — | — | — | 15.2 | — |
| Triphenylphosphine oxide | — | — | — | — | — | 19.4 |
| 2-Methylimidazole | 0.1 | 0.1 | 0.1 | 0.1 | 0.1 | 0.1 |

TABLE 2

| Property | Ex. 1 | Ex. 2 | Ex. 3 | Ex. 4 | Control Ex. 1 | Control Ex. 2 |
|---|---|---|---|---|---|---|
| Flame retardancy | 94V-0 | 94V-0 | 94V-0 | 94V-0 | 94V-0 | 94V-0 |
| Soldering heat resistance | Fine | Fine | Fine | Fine | Fine | Swelling |
| Water absorption (%) | 0.12 | 0.12 | 0.13 | 0.15 | 0.12 | 0.12 |
| Glass transition temp (° C.) | 168 | 185 | 146 | 161 | 168 | 165 |
| Peel strength (kN/m) | 1.5 | 1.3 | 1.5 | 1.4 | 1.2 | 1.2 |
| Percent change in gel time of varnish after 5 days (%) | 1 | 3 | 0 | 5 | −25 | 3 |

IV. EVALUATION METHODS (1) Flame Retardancy: This was evaluated according to the conventional UL TM 650 vertical method.

(2) Soldering Heat Resistance: This was determined according to JIS C 6481 test method. Each test piece, which had been subjected to a moisture-absorbing treatment by 2-hour boiling, was immersed in a 260° C. solder bath for 120 seconds and examined for abnormality of external appearance.

(3) Water Absorption: This was determined according to JIS C 6481 test method.

(4) Glass Transition Temperature: This was determined from a peak temperature of tan δ according to a conventional JIS C 6481 viscoelasticity method.

(5) Peel Strength: This was determined according to JIS C 6481 test method.

(6) Percent Change in Gelling Time of Resin Varnish: This was calculated by comparing the gelling time immediately after the blending of the resin varnish and the gelling time after holding in a sealed state at 23° C. for 5 days.

The data presented in TABLE 2 shows that Examples 1 to 4, corresponding to the resin compositions in accordance with the embodiments of the present invention, have storage stability (as determined by the percent change in gelling time) equal to or better than the Control Examples. Further, the laminates produced from the prepregs using these resin compositions exhibit flame retardancy, heat resistance, and adhesion equal to or better than such Control Examples.

In contrast, in Control Example 1, the percent change in the gelling time of the resin varnish was relatively large. Further, in Control Example 2, the dicyandiamide precipitated and the soldering heat resistance was reduced.

While the invention has been explained in relation to descriptions of various embodiments and examples, it is to be understood that modifications thereof will become apparent to those skilled in the art upon reading this specification. Any such modifications are therefore within the scope and spirit of the embodiments of the present invention and shall be understood to fall within the scope of the appended claims.

What is claimed is:

1. A resin composition, comprising:
   a halogen-free epoxy resin comprising a novolak epoxy resin;
   dicyandiamide present in the range of 3 to 6% by weight of the total amount of said halogen-free epoxy resin; and
   10-benzyl-9,10-dihydro-9-oxa-10-phosphaphenanthrene-10-oxide.

2. The resin composition according to claim 1, wherein the amount of said novolak epoxy resin in said halogen-free epoxy resin is in the range of 60 to 90% by weight of the total amount of said halogen-free epoxy resin.

3. The resin composition according to claim 1, wherein the amount of said novolak epoxy resin in said halogen-free epoxy resin is in the range of 65 to 75% by weight of the total amount of said halogen-free epoxy resin.

4. The resin composition according to claim 1, wherein said novolak epoxy resin is a cresol-novolak epoxy resin.

5. The resin composition according to claim 1, wherein said dicyandiamide is present in the range of 3.5 to 5.5% by weight of the total amount of said halogen-free epoxy resin.

6. The resin composition according to claim 1, wherein said 10-benzyl-9,10-dihydro-9-oxa-10-phosphaphenanthrene-10-oxide is present in the range of 13 to 28% by weight of the total amount of said halogen-free epoxy resin.

7. The resin composition according to claim 1, wherein said 10-benzyl-9,10-dihydro-9-oxa-10-phosphaphenanthrene-10-oxide is present in the range of 15 to 22% by weight of the total amount of said halogen-free epoxy resin.

8. A prepreg obtained by impregnating a fiber substrate with a resin composition according to any one of claims 1-2 and 5-6.

9. A laminate obtained by hot-pressing at least one prepreg according to claim 8.

10. A metal-clad laminate obtained by hot-pressing at least one prepreg according to claim 8 and at least one metal foil.

11. A metal-clad laminate obtained by placing two or more prepregs according to claim 8 one over another to prepare a stack of prepregs, placing a metal foil on at least one of top and bottom surfaces of the stack, and hot-pressing the stack and the foil.

12. A prepreg obtained by dissolving or dispersing a resin composition according to any one of claims 1-2 and 5-6 in a solvent to prepare a resin varnish and impregnating a fiber substrate with the resin varnish.

13. The resin composition of claim 1, wherein said halogen-free epoxy resin further comprises a further halogen-free epoxy resin selected from the group consisting of bisphenol A epoxy resin, bisphenol F epoxy resin and combinations thereof.

14. The resin composition of claim 13, wherein said further halogen-free epoxy resin is selected from bisphenol A epoxy resin.

15. The resin composition of claim 7, wherein said halogen-free epoxy resin further comprises bisphenol A epoxy resin and bisphenol F epoxy resin.

16. A method of preparing a resin composition comprising utilizing dicyandiamide as a curing agent and 10-benzyl-9,10-dihydro-9-oxa-10-phosphaphenanthrene-10-oxide as a flame retardant agent in the resin composition comprising an epoxy resin including a novolak epoxy resin, wherein the dicyandiamide is present in a range of 3 to 6% by weight of the total amount of the epoxy resin.

* * * * *

UNITED STATES PATENT AND TRADEMARK OFFICE
CERTIFICATE OF CORRECTION

| | | |
|---|---|---|
| PATENT NO. | : 7,910,639 B2 | Page 1 of 1 |
| APPLICATION NO. | : 11/491538 | |
| DATED | : March 22, 2011 | |
| INVENTOR(S) | : Akihiko Tobisawa | |

It is certified that error appears in the above-identified patent and that said Letters Patent is hereby corrected as shown below:

Column 12, Lines 42-43, Claim 8, "of claims 1-2 and 5-6" should read -- of claims 1-4 and 5-7 --

Column 12, Line 54, Claim 12, "of claims 1-2 and 5-6" should read -- of claims 1-4 and 5-7 --

Column 12, Line 65, Claim 15, "of claim 7" should read -- of claim 1 --

Signed and Sealed this
Thirty-first Day of May, 2011

David J. Kappos
*Director of the United States Patent and Trademark Office*